(12) United States Patent
Liu et al.

(10) Patent No.: US 10,818,597 B2
(45) Date of Patent: *Oct. 27, 2020

(54) HYBRID COPPER STRUCTURE FOR ADVANCE INTERCONNECT USAGE

(71) Applicant: Taiwan Semiconductor Manufacturing Co., Ltd., Hsin-Chu (TW)

(72) Inventors: Hsiang-Wei Liu, Tainan (TW); Tai-I Yang, Hsinchu (TW); Cheng-Chi Chuang, New Taipei (TW); Tien-Lu Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/384,027

(22) Filed: Apr. 15, 2019

(65) Prior Publication Data

US 2019/0244897 A1    Aug. 8, 2019

Related U.S. Application Data

(63) Continuation of application No. 15/819,280, filed on Nov. 21, 2017, now Pat. No. 10,290,580, which is a
(Continued)

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76802* (2013.01); *H01L 21/76838* (2013.01);
(Continued)

(58) Field of Classification Search
CPC .......... H01L 23/5283; H01L 23/53257; H01L 23/53228; H01L 2924/0002;
(Continued)

(56) References Cited

U.S. PATENT DOCUMENTS 6,426,249 B1    7/2002  Geffken et al.
6,548,901 B1    4/2003  Cote et al.
(Continued)

FOREIGN PATENT DOCUMENTS

JP    2002368081 A    12/2002
JP    2004063995 A    2/2004

OTHER PUBLICATIONS

Non-Final Office Action dated Jun. 17, 2016 for U.S. Appl. No. 14/321,890.
(Continued)

*Primary Examiner* — Bac H Au
(74) *Attorney, Agent, or Firm* — Eschweiler & Potashnik, LLC

(57) ABSTRACT

The present disclosure, in some embodiments, relates to an integrated chip. The integrated chip includes a dielectric structure over a substrate, and a first interconnect structure arranged within the dielectric structure. A lower interconnect structure is arranged within the dielectric structure. The first interconnect structure and the lower interconnect structure comprise one or more different conductive materials. The first interconnect structure continuously extends from directly over a topmost surface of the lower interconnect structure facing away from the substrate to along opposing outer sidewalls of the lower interconnect structure.

20 Claims, 5 Drawing Sheets

Related U.S. Application Data continuation of application No. 14/321,890, filed on Jul. 2, 2014, now Pat. No. 9,837,354.

(51) Int. Cl.
*H01L 23/522* (2006.01)
*H01L 23/532* (2006.01)

(52) U.S. Cl.
CPC .. *H01L 21/76877* (2013.01); *H01L 21/76879* (2013.01); *H01L 23/5226* (2013.01); *H01L 23/53228* (2013.01); *H01L 23/53257* (2013.01); *H01L 23/53238* (2013.01); *H01L 23/53266* (2013.01); *H01L 23/53295* (2013.01); *H01L 2924/0002* (2013.01)

(58) Field of Classification Search
CPC ......... H01L 23/53295; H01L 23/53266; H01L 23/53238
See application file for complete search history.

(56) References Cited

U.S. PATENT DOCUMENTS

| | | | |
|---|---|---|---|
| 6,759,332 B2 | 7/2004 | Clevenger et al. | |
| 8,525,339 B2 | 9/2013 | Yang et al. | |
| 8,765,600 B2 | 7/2014 | Chang et al. | |
| 9,054,164 B1* | 6/2015 | Jezewski | H01L 21/76879 |
| 9,153,483 B2* | 10/2015 | Shieh | H01L 21/76879 |
| 9,171,801 B2 | 10/2015 | Bao et al. | |
| 10,290,580 B2* | 5/2019 | Liu | H01L 21/76802 |
| 2007/0155165 A1 | 7/2007 | Park et al. | |
| 2008/0079167 A1 | 4/2008 | Yang | |
| 2009/0238958 A1 | 9/2009 | Sinha | |
| 2011/0034026 A1 | 2/2011 | Sunayama et al. | |
| 2013/0320545 A1 | 12/2013 | Yang et al. | |
| 2014/0021614 A1 | 1/2014 | Yu et al. | |
| 2015/0097283 A1 | 4/2015 | Daubenspeck et al. | |
| 2015/0228584 A1 | 8/2015 | Huang et al. | |
| 2015/0270215 A1 | 9/2015 | Peng et al. | |
| 2016/0111371 A1* | 4/2016 | Peng | H01L 23/53238 257/751 |

OTHER PUBLICATIONS

Final Office Action dated May 18, 2017 for U.S. Appl. No. 14/321,890.
Notice of Allowance dated Aug. 2, 2017 for U.S. Appl. No. 14/321,890.
Non-Final Office Action dated Jul. 2, 2018 for U.S. Appl. No. 15/819,280.
Final Office Action dated Jan. 2, 2019 for U.S. Appl. No. 15/819,280.
Notice of Allowance dated Mar. 14, 2019 for U.S. Appl. No. 15/819,280.

* cited by examiner

HYBRID COPPER STRUCTURE FOR ADVANCE INTERCONNECT USAGE

REFERENCE TO RELATED APPLICATIONS

This Application is a Continuation of U.S. application Ser. No. 15/819,280, filed on Nov. 21, 2017, which is a Continuation of U.S. application Ser. No. 14/321,890, filed on Jul. 2, 2014 (now U.S. Pat. No. 9,837,354, issued on Dec. 5, 2017). The contents of the above-referenced patent applications are hereby incorporated by reference in their entirety.

BACKGROUND

Modern day integrated chips (ICs) often comprise billions of transistor devices disposed within a semiconductor substrate. Back-end-of-the-line (BEOL) metallization layers are used to connect the transistor devices to each other and to the outside world. BEOL metallization layers are stacked layers of small conductive metal wires and vias that are disposed within a dielectric material overlying the semiconductor substrate. The metal wires provide for lateral connections while the vias provide for vertical connections between metal wires. Typically, the stacked BEOL metallization layers increase in size as the metallization layers get further from the semiconductor substrate, such that tightly packed small metal wires are located near the transistor devices and larger metal wires are located near a top of the stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
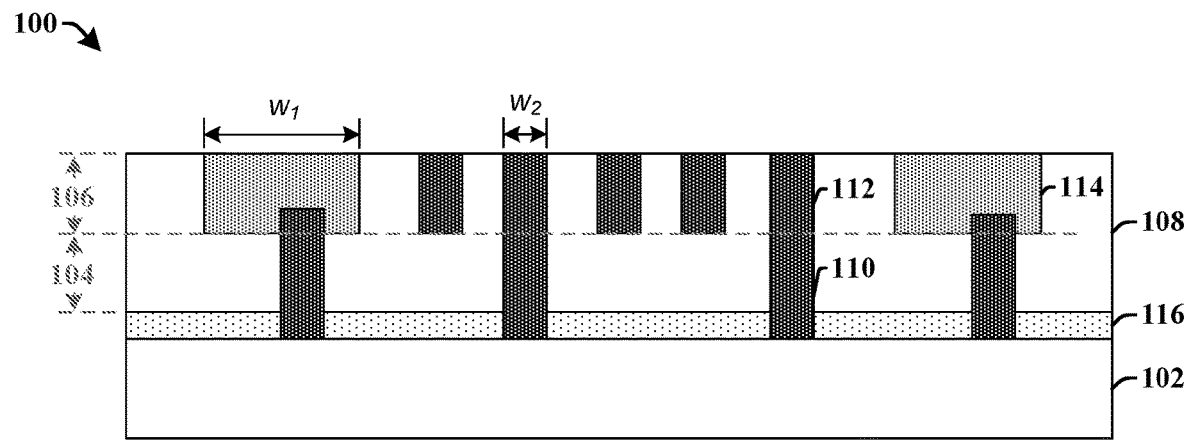
FIG. 1 illustrates a cross-sectional view of some embodiments of an integrated chip having a back-end-of-the-line (BEOL) metallization layer comprising laterally separated metal interconnect structures having different conductive materials.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the past 15-20 years, copper has become a commonly used material for (back-end-of-the-line) BEOL metallization layers. Copper has a very high electrical conductivity, which provides for relatively low resistance on the BEOL and therefore good integrated chip performance. Copper metallization layers (e.g., metal wires and vias) are often formed using a damascene process in which copper is deposited into a patterned dielectric material. For example, in a dual damascene process a dielectric material is deposited over a semiconductor substrate. The dielectric material is selectively etched to form openings for a via (i.e., a via hole) and a metal wire (i.e., a metal trench). The openings are then filled with copper and a planarization process is performed to remove excess copper from the substrate.

As the size of integrated chip components has been scaled downward, the size of thin metallization layers (i.e., metallization layers used for local routing between transistors) have decreased. It has been appreciated that in emerging technology nodes (e.g., technology nodes having via holes and/or metal trenches with minimum dimensions less than 40 nm), gap-fill issues begin to arise which make it increasingly difficult for damascene processes to fill via holes and/or metal trenches with copper. For example, it is difficult to use copper damascene plating processes to fill openings having a minimum dimension of less than 30 nm, therefore resulting in the formation of voids (e.g., cavities devoid of copper) in resulting metal wires and vias. The voids can lead to electrical opens in a BEOL metallization layer that are detrimental to reliability of an integrated chip.

Accordingly, the present disclosure relates to a method of forming a BEOL metallization layer that mitigates gap-fill problems by using different conductive materials (e.g., metals) to fill different size openings in an inter-level dielectric (ILD) layer, and an associated apparatus. In some embodiments, the present disclosure relates to an integrated chip comprising a first plurality of metal interconnect structures disposed within a first BEOL metallization layer, which include a first conductive material. The integrated chip further comprises a second plurality of metal interconnect structures disposed within the first BEOL metallization layer at positions laterally separated from the first plurality of metal interconnect structures. The second plurality of metal interconnect structures comprise a second conductive material that is different than the first conductive material. By forming different metal interconnect structures on a same BEOL metallization layer using different conductive materials, gap-fill problems in narrow BEOL metal interconnect structures can be mitigated, thereby improving the reliability of an integrated chip.

FIG. 1 illustrates a cross-sectional view of some embodiments of an integrated chip 100 having a back-end-of-the-line (BEOL) metallization layer comprising laterally separated metal interconnect structures with different conductive materials.

The integrated chip 100 comprises a plurality of back-end-of-the-line (BEOL) metallization layers, 104 and 106, disposed within an inter-level dielectric (ILD) layer 108 overlying a semiconductor substrate 102. In various embodiments, the semiconductor substrate 102 may comprise any type of semiconductor body (e.g., silicon, silicon germanium (SiGe), SOI, etc.) such as a semiconductor wafer or one or more die on a wafer, as well as any other type of semiconductor and/or epitaxial layers formed thereon and/or otherwise associated therewith. In some embodiments, the ILD layer 108 may comprise one or more dielectric materials, such as a low-k dielectric material or an ultra-low-k (ULK) dielectric material, for example. In some embodiments, an etch stop layer (ESL) 116 may be disposed between the ILD layer 108 and the semiconductor substrate 102. In various embodiments, the ESL 116 may comprise nitride, silicon carbide, carbon-doped oxide, or other similar materials.

The plurality of BEOL metallization layers comprise a metal via layer 104 and an overlying metal wire layer 106. The metal via layer 104 comprises a plurality of vias 110 disposed within the ILD layer 108, which are configured to provide for vertical interconnections (i.e., interconnections in a direction perpendicular to a top surface of the semiconductor substrate 102). The metal wire layer 106 is configured to provide for lateral interconnections (i.e., interconnections in a direction parallel to a top surface of the semiconductor substrate 102).

The metal wire layer 106 comprises a first plurality of metal interconnect structures 112 and a second plurality of metal interconnect structures 114. The first plurality of metal interconnect structures 112 are laterally separated from the second plurality of metal interconnect structures 112 by the ILD layer 108. The first plurality of metal interconnect structures 112 have a smaller width (i.e., minimum dimension) than the second plurality of metal interconnect structures 114. For example, the first plurality of metal interconnect structures 112 have a first width $w_1$ and the second plurality of metal interconnect structures 114 have a second width $w_2$ that is greater than the first width $w_1$. In some embodiments, the first width $w_1$ has a value that is in range of between approximately 3 nm and approximately 30 nm, while the second width $w_2$ has a value that is greater than approximately 30 nm.

The first plurality of metal interconnect structures 112 include a first conductive material and the second plurality of metal interconnect structures 114 include a second conductive material that is different than the first conductive material. The first conductive material comprises a material having an ability to fill small gaps (i.e., small openings in the ILD layer 108) that are not able to be easily filled by the second conductive material. By using the first conductive material for metal interconnect structures having a relatively small width and the second conductive material for the metal interconnect structures having a larger width, gap-fill problems on BEOL metallization layers can be mitigated without substantially compromising performance (e.g., resistivity) of the metal wire layer 106. For example, in some embodiments, the first conductive material may comprise cobalt or tungsten, while the second conductive material may comprise copper. When deposited by a vapor deposition technique (e.g., chemical vapor deposition, atomic layer deposition, etc.), cobalt and tungsten offer better gap-fill capabilities than copper for openings having a small width/minimum dimension (e.g., less than or equal to approximately 30 nm). In some embodiments, the plurality of vias 110 may also comprise the first conductive material, so as to prevent gap-fill problems within the metal via layer 104.

In some embodiments, one or more of the plurality of vias 110 may vertically extend to a position that overlaps the second plurality of metal interconnect structures 114, such that the one or more of the plurality of vias 110 that are laterally aligned with of the second plurality of metal interconnect structures 114 extend to positions within the second plurality of metal interconnect structures 114. In other words, the one or more of the plurality of vias 110 that are laterally aligned with the second plurality of metal interconnect structures 114 abut the second plurality of metal interconnect structures 114 on three sides.

Although integrated chip 100 describes and illustrates a BEOL metal wire layer 106 comprising laterally separated metal interconnect structures having different conductive materials, it will be appreciated that the present disclosure is not limited to metal wire layers having different conductive materials. In other embodiments, laterally separated metal vias may also and/or alternatively have different conductive materials.

Figure 2:
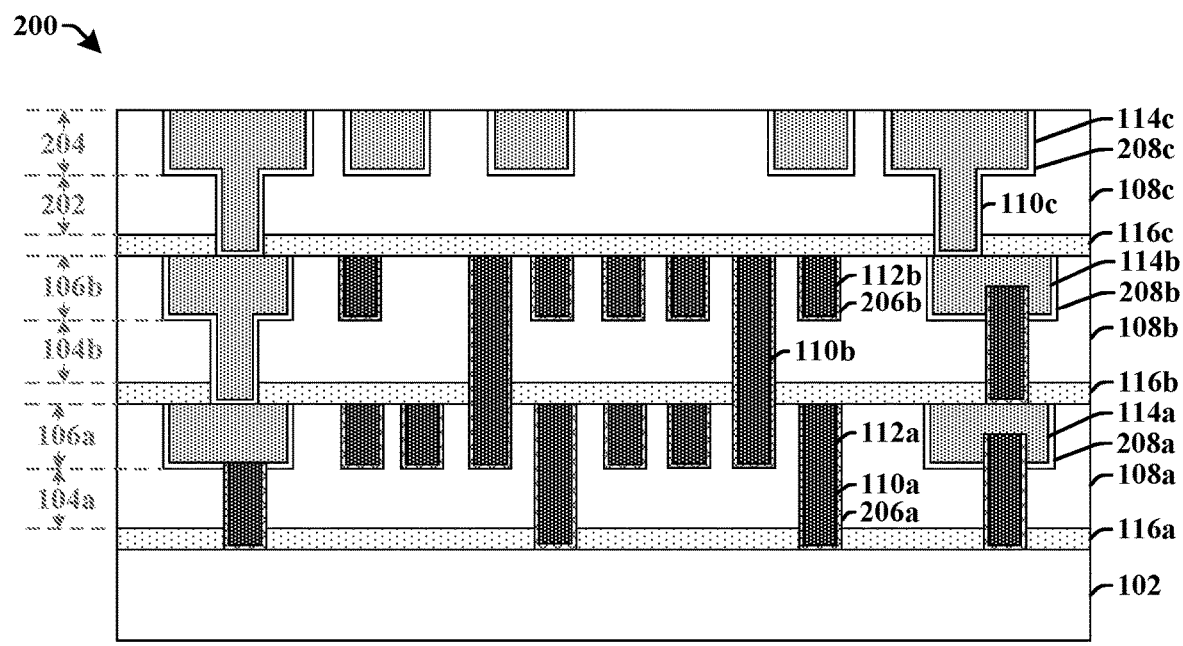
FIG. 2 illustrates a cross-sectional view of some embodiments of an integrated chip having a BEOL metallization layer comprising laterally separated metal interconnect structures having different conductive materials.

FIG. 2 illustrates a cross-sectional view of some embodiments of an integrated chip 200 having a BEOL metallization layer comprising laterally separated metal interconnect structures having different conductive materials.

The integrated chip 200 comprises a plurality of stacked BEOL metallization layers 104a-204, which are disposed within a plurality of inter-level dielectric (ILD) layers 108a-108c overlying a semiconductor substrate 102. In some embodiments, etch stop layers (ESL) 116a-116c are disposed between the plurality of ILD layers 108a-108c. For example, a first ESL 116a is disposed between a first ILD layer 108a and a second ILD layer 108b, a second ESL 116b is disposed between the second ILD layer 108b and a third ILD layer 108c.

A first via layer 104a and an overlying first metal wire layer 106a are disposed within the first ILD layer 108a. The first via layer 104a comprises a plurality of vias 110a. The first metal wire layer 106a comprises a first plurality of metal interconnect structures 112a having a first conductive material and a second plurality of metal interconnect structures 114a having a second conductive material that is different than the first conductive material. In some embodiments, a first liner layer 206a separates the first plurality of metal interconnect structures 112a from the first ILD layer 108a and a second liner layer 208a separates the second plurality of metal interconnect structures 114a from the first ILD layer 108a. In some embodiments, the first liner layer 206a and the second liner layer 208a may comprise different materials. For example, in some embodiments, the first liner layer 206a may comprise titanium (Ti), titanium nitride (TiN), tantalum (Ta), or tantalum nitride (TaN), while the second liner layer 208a may comprise tantalum nitride (TaN), tantalum (Ta), cobalt (Co), ruthenium (Ru), or titanium nitride (TiN).

In some embodiments, the plurality of stacked BEOL metallization layers 104a-204 may have different minimum width (i.e., minimum dimension) values. For example, metal wire layers 106a and 106b may have features having a first minimum width value (e.g., less than or equal to approximately 30-40 nm), while the metal wire layer 204 may have features having a second minimum width value that is greater than the first minimum width value (e.g., greater than or equal to approximately 40-50 nm). In some embodiments, the minimum width of metal wire layer 204 may be large enough so that gap-fill issues are not present in the metal wire layer 204. In such embodiments, metal wire layers 106a and 106b may comprise laterally separated metal wires including the first and second conductive materials, while metal wire layer 204 may comprise laterally separated metal wires including the first conductive material and not the second conductive material.

Figure 3:
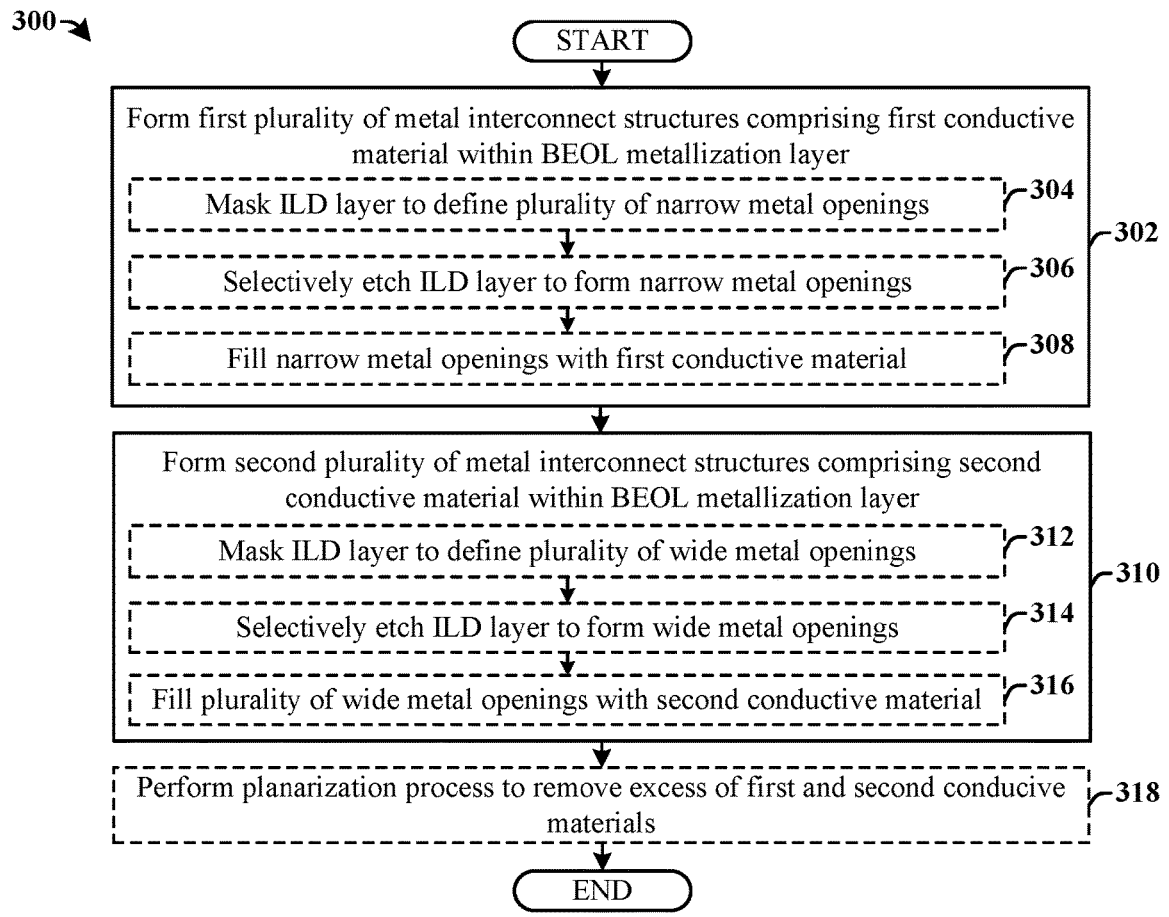
FIG. 3 illustrates a flow diagram of some embodiments of a method of forming a BEOL metallization layer comprising laterally separated metal interconnect structures having different conductive materials.

FIG. 3 illustrates a flow diagram of some embodiments of a method 300 of forming a BEOL metallization layer comprising laterally separated metal interconnect structures having different conductive materials.

While disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a first plurality of metal interconnect structures comprising a first conductive material are formed within a back-end-of-the-line (BEOL) metallization overlying a semiconductor substrate. In some embodiments, the first plurality of metal interconnect structures may be formed by selectively masking an inter-level dielectric (ILD) layer according to a first masking layer that defines a plurality of narrow metal openings, at 304. At 306, the ILD layer is selectively etched to form the narrow metal openings within the ILD layer. At 308, the narrow metal openings are filled with a first conductive material to form the first plurality of metal interconnect structures.

At 310, a second plurality of metal interconnect structures, comprising a second conductive material that is different than the first conductive material, are formed within the BEOL metallization layer. In some embodiments, the second plurality of metal interconnect structures may be formed by selectively masking the ILD layer to define wide metal openings, at 312. At 314, the ILD layer is then selectively etched to form the wide metal openings within the ILD layer. At 316, the wide metal openings are filled with a second conductive material to form the second plurality of metal interconnect structures.

At 318, a planarization process may be performed to remove excess of the first and second conductive materials from the substrate, in some embodiments.

It will be appreciated that method 300 may be performed according to different back-end-of-the-line fabrication techniques. For example, in some embodiments, the method 300 may be performed according to a damascene process. In such embodiments, the first and second plurality of metal interconnect structures may be implemented as a metal layer of a dual damascene process or as a metal layer of a single damascene process. In other embodiments, the method 300 may be performed according to a non-damascene process.

FIGS. 4A-10 illustrate some embodiments of cross-sectional views showing a method 300 of forming a BEOL metallization layer comprising laterally separated metal interconnect structures having different conductive materials. Although FIGS. 4A-10 are described in relation to method 300, it will be appreciated that the structures disclosed in FIGS. 4A-10 are not limited to such a method, but instead may stand alone as structures independent of the method 300.

Figure 4A:
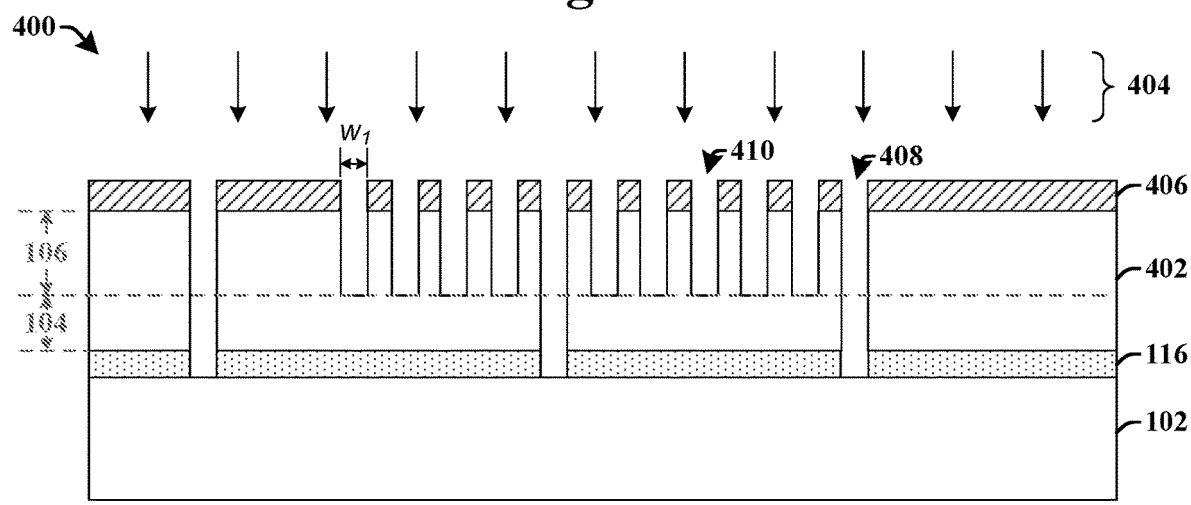
FIGS. 4A-10 illustrate some embodiments of cross-sectional views showing a method of forming a BEOL metallization layer comprising laterally separated metal interconnect structures having different conductive materials.
Figure 4B:
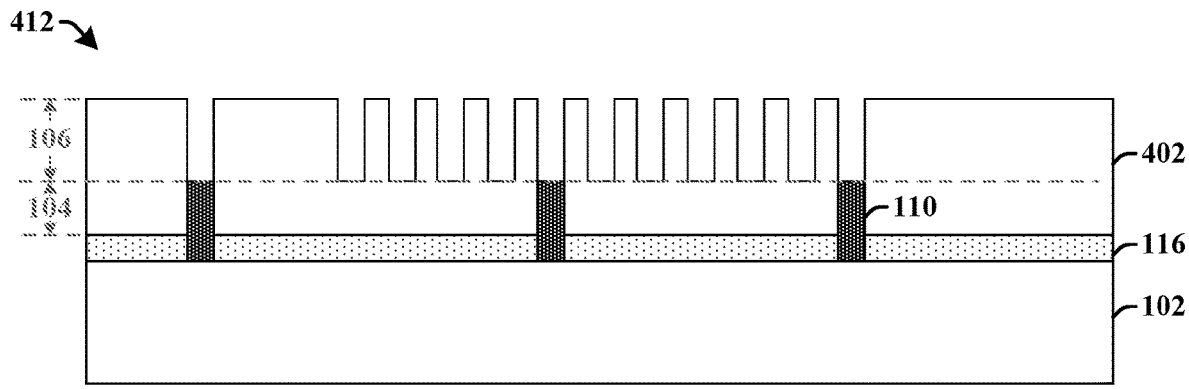

FIGS. 4A-4B illustrates some embodiments of cross-sectional views, 400 and 412, corresponding to acts 304-306.

FIG. 4A illustrates some embodiments of a cross-sectional view of an implementation of acts 304-306 as a dual damascene process. As shown in cross-sectional view 400, an inter-level dielectric (ILD) layer 402 is formed over a semiconductor substrate 102. In some embodiments, the ILD layer 402 may comprise a low-k dielectric layer or an ultra-low-k (ULK) dielectric layer, formed by way of a thermal process or a deposition process. In some embodiments, an etch stop layer (ESL) 116 may be formed between the ILD layer 402 and the semiconductor substrate 102. In various embodiments, the ESL 116 may comprise nitride, silicon carbide, carbon-doped oxide, or other similar materials.

The ILD layer 402 is exposed to a first etchant 404 that is configured to selectively etch the first ILD layer 402 according to a first masking layer 406 to form a plurality of narrow metal openings, 408 and 410. In some embodiments, the first masking layer 406 may comprise a photoresist layer. The plurality of narrow metal openings, 408 and 410, have a first width $w_1$ In some embodiments, the first width $w_1$ may have a value that is less than or equal to approximately 30 nm. In some embodiments, the first etchant 404 may comprise a plasma etchant having an etching chemistry comprising one or more of fluorine (F), Tetrafluoromethane ($CF_4$), ozone ($O_2$), or $C_4F_8$ (Octafluorocyclobutane), for example. In some embodiments, the plurality of narrow metal openings, 408 and 410, may comprise a narrow metal trench opening 408 extending through a metal wire layer 106 and/or a narrow metal trench and via opening 410 extending through a metal via layer 104 and the metal wire layer 106.

FIG. 4B illustrates some embodiments of a cross-sectional view of an implementation of acts 304-306 as a single damascene process. As shown in cross-sectional view 400, the narrow metal openings, 408 and 410, may comprise a metal trench opening disposed over a via 110.

Figure 5:
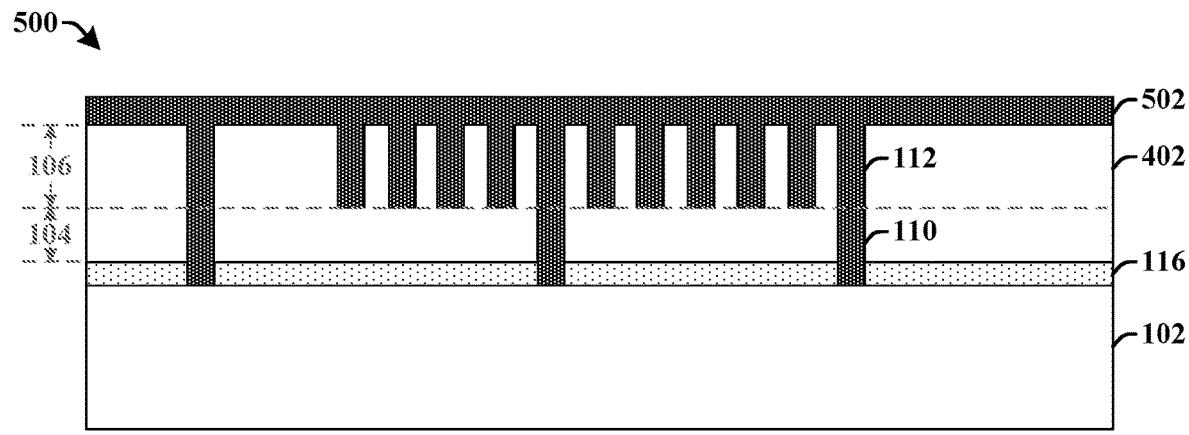

FIG. 5 illustrates some embodiments of a cross-sectional view 500 corresponding to act 308.

As shown in cross-sectional view 500, a first conductive material 502 is deposited to fill the plurality of narrow metal openings, 408 and 410. In some embodiments, the first conductive material 502 may extend out of the narrow metal openings, 408 and 410, to form a continuous layer that extends over a top surface of the ILD layer 402. The first conductive material 502 comprises a material having an ability to fill narrow metal openings, 408 and 410, without forming voids. In some embodiments, the first conductive material 502 may comprise tungsten (W) or cobalt (Co) deposited using a deposition technique such as a chemical vapor deposition (CVD) process or an atomic layer deposition (ALD) process.

For example, in some embodiments, the first conductive material 502 may comprise cobalt deposited using a CVD process performed within a processing chamber held at a temperature in a range of between approximately 100° C. and approximately 300° C. and at a pressure in a range of between approximately 10 torr and approximately 50 torr. In such embodiments, the CVD process may use processing gases of $C_5H_5(CO)_2Co$ and $H_2$. In other embodiments, the first conductive material 502 may comprise cobalt deposited using an ALD process performed within a processing chamber held at a temperature in a range of between approximately 100° C. and approximately 300° C. and at a pressure in a range of between approximately 0.1 torr and approximately 10 torr. In such embodiments, the ALD process may use processing gases of (($C_5H_5$)Co(CO)$_2$), $H_2$, $N_2$, and $NH_3$.

In some other embodiments, the first conductive material 502 may comprise tungsten deposited using a CVD process performed within a processing chamber held at a temperature in a range of between approximately 300° C. and approximately 500° C. and at a pressure in a range of between approximately 1 torr and approximately 10 torr. In such embodiments, the CVD process may use processing gases of $WF_6$ and $H_2$. In other embodiments, the first conductive material 502 may comprise tungsten deposited using an ALD process performed within a processing chamber held at a temperature in a range of between approximately 200° C. and approximately 400° C. and at a pressure in a range of between approximately 1 torr and approximately 10 torr. In such embodiments, the ALD process may use processing gases $WF_6$ and $B_2H_6$.

Figure 6:
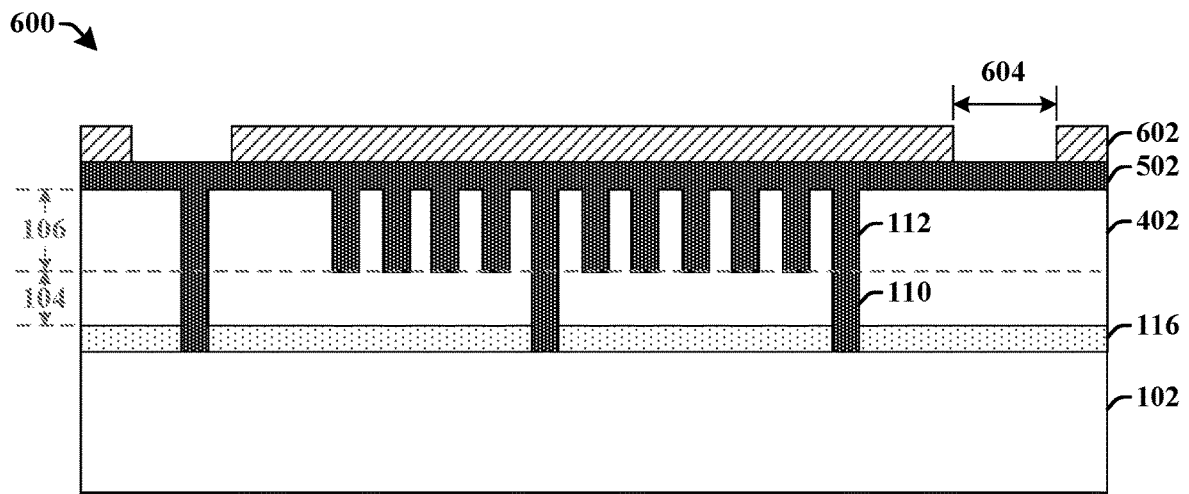

FIG. 6 illustrates some embodiments of a cross-sectional view 600 corresponding to act 312.

As shown in cross-sectional view 600, a second masking layer 602 is selectively formed over the first conductive material 502. The second masking layer 602 defines a plurality of wide metal openings 604 within the ILD layer 402. In some embodiments, the second masking layer 602 may comprise a photoresist layer. In some embodiments, the photoresist layer may be used to selectively etch the first conductive material 502 so that the first conductive material 502 can be used as a hard mask overlying the ILD layer 402.

Figure 7:
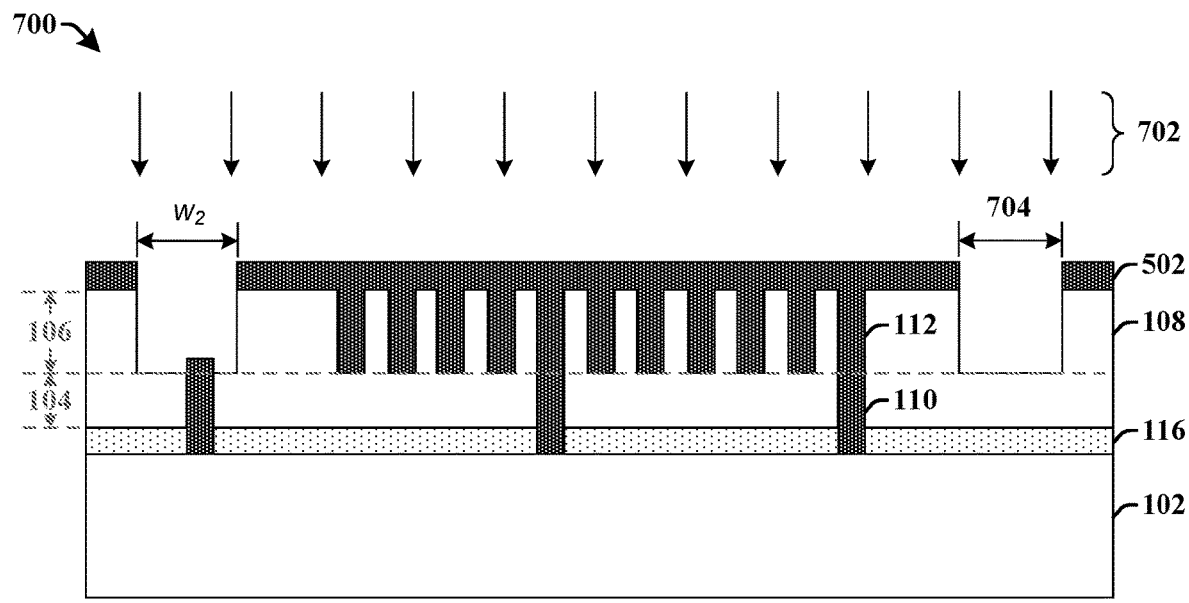

FIG. 7 illustrates some embodiments of a cross-sectional view 700 corresponding to act 314.

As shown in cross-sectional view 700, the ILD layer 402 is exposed to a second etchant 702 that is configured to selectively etch the ILD layer 402 to form a plurality of wide metal openings 704. In some embodiments, the second etchant 702 may comprise a plasma etchant having an etching chemistry comprising one or more of F, $CF_4$, $O_2$, or $C_4F_8$, for example. In some embodiments, the plurality of wide metal openings 704 may have a second width $w_2$ that is larger than the first width $w_1$. In some embodiments, the second width $w_2$ has a value that is greater than or equal to approximately 30 nm.

In some embodiments, the second etchant 702 is configured to over etch the ILD layer 402 to a position that causes plurality of wide metal openings 704 to extend within the ILD layer 402 to a vertical location that is below a top surface of one or more of the plurality of vias 110. In such embodiments, one or more of the plurality vias 110 extend outward from the bottom of the plurality of wide metal openings 704 as positive reliefs. By causing the plurality of vias 110 to extend outward from the bottom of the plurality of wide metal openings 704, a good electrical connection is made between the plurality of vias 110 and an overlying metal layer disposed within the plurality of wide metal openings 704.

Figure 8:
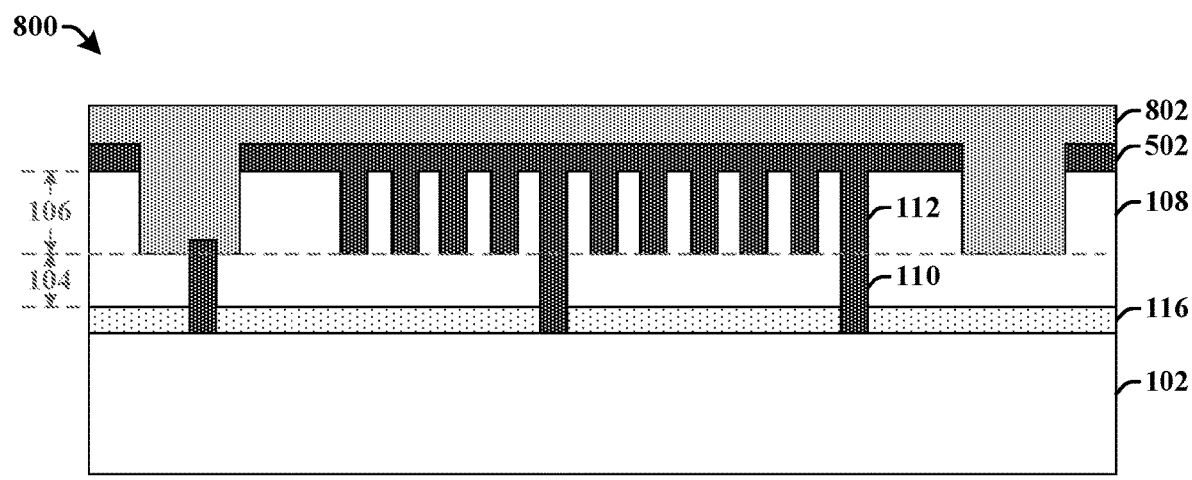

FIG. 8 illustrates some embodiments of a cross-sectional view 800 corresponding to act 316.

As shown in cross-sectional view 800, a second conductive material 802 is deposited to fill the plurality of wide metal openings 704. The second conductive material 802 is different than the first conductive material 502, so that different conductive materials (502 and 802) are laterally disposed apart from one another. In some embodiments, the second conductive material 802 may comprise copper. In some embodiments, the second conductive material 802 may be deposited by way of a plating process (e.g., an electro plating process, an electro-less plating process). In other embodiments, the second conductive material 802 may be deposited using a vapor deposition technique (e.g., CVD, PVD, ALD, etc.).

Figure 9:
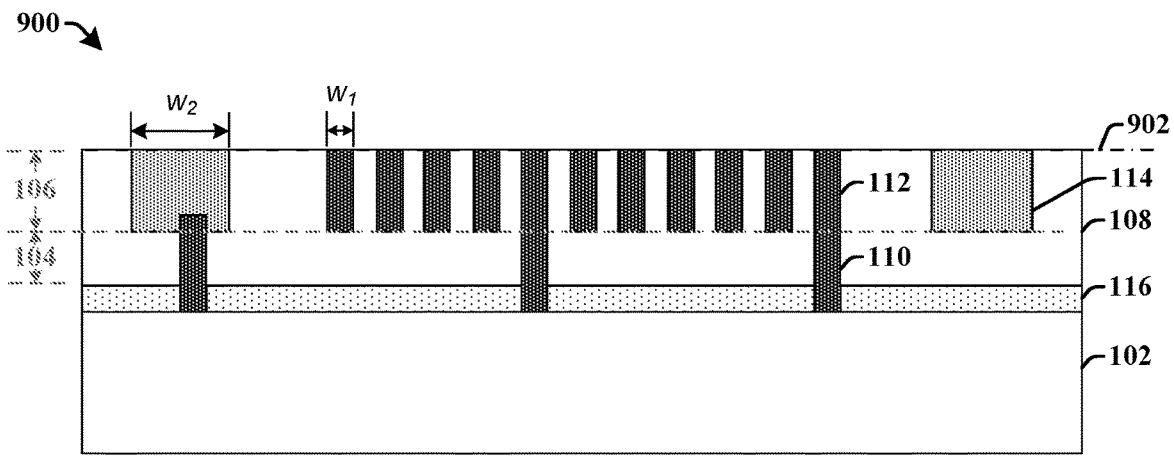

FIG. 9 illustrates some embodiments of a cross-sectional view 900 corresponding to act 318.

As shown in cross-sectional view 900, a planarization process is performed to form a flat surface along line 902 by removing excess of the first and second conductive materials, 502 and 802, from the substrate. In some embodiments, the planarization process may comprise a chemical mechanical polishing (CMP) process.

Figure 10:
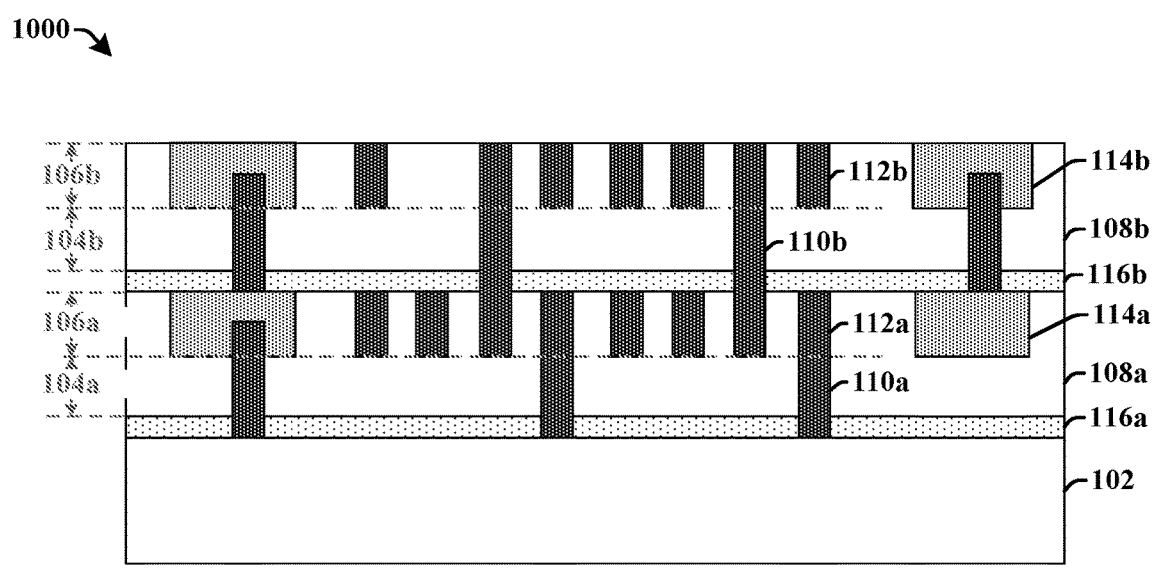

It will be appreciated that method 300 may be iteratively performed to form a plurality of stacked BEOL metallization layers overlying the semiconductor substrate 102. FIG. 10 illustrates some embodiments of a cross-sectional view 1000 of an integrated chip having a BEOL stack comprising a plurality of BEOL metallization layers formed according to method 300. As shown in cross-sectional view 1000, the integrated chip has a first metal wire layer 106a comprising laterally separated metal interconnect structures having different conductive materials and a second metal wire layer 106b comprising laterally separated metal interconnect structures having different conductive materials.

Therefore, the present disclosure relates to a method of forming a BEOL metallization layer that mitigates gap-fill problems by using different conductive materials (e.g., metals) to fill different size openings in an inter-level dielectric (ILD) layer, and an associated apparatus.

In some embodiments, the present disclosure relates to an integrated chip. The integrated chip comprises a first plurality of metal interconnect structures disposed within a first back-end-of-the-line (BEOL) metallization layer and comprising a first conductive material. The integrated chip further comprises a second plurality of metal interconnect structures disposed within the first BEOL metallization layer at positions laterally separated from the first plurality of metal interconnect structures, wherein the second plurality of metal interconnect structures comprise a second conductive material that is different than the first conductive material.

In other embodiments, the present disclosure relates to an integrated chip. The integrated chip a first plurality of metal interconnect structures disposed within a first metal wire layer and comprising a first metal. The integrated chip further comprises a second plurality of metal interconnect structures disposed within the first metal wire layer at positions laterally separated from the first plurality of metal interconnect structures by an inter-level dielectric (ILD) layer, wherein the second plurality of metal interconnect structures comprise a second metal that is different than the first metal. The first plurality of metal interconnect structures have a first width and the second plurality of metal interconnect structures have a second width that is larger than the first width.

In yet other embodiments, the present disclosure relates to a method of forming a back-end-of-the-line (BEOL) metallization layer. The method comprises forming a first plurality of metal interconnect structures comprising a first conductive material within a first BEOL metallization layer overlying a semiconductor substrate. The method further comprises forming a second plurality of metal interconnect structures comprising a second conductive material within the first BEOL metallization at positions laterally separated from the first plurality of metal interconnect structures, wherein the second conductive material is different than the first conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a dielectric structure over a substrate;
   a first interconnect structure arranged within the dielectric structure;
   a lower interconnect structure arranged within the dielectric structure, wherein the first interconnect structure and the lower interconnect structure comprise one or more different conductive materials; and
   wherein the first interconnect structure continuously extends from directly over a topmost surface of the lower interconnect structure facing away from the substrate to along opposing outer sidewalls of the lower interconnect structure.

2. The integrated chip of claim 1, wherein the topmost surface of the lower interconnect structure is disposed along a horizontal plane that intersects sidewalls of the first interconnect structure, the horizontal plane parallel to an upper surface of the substrate facing the dielectric structure.

3. The integrated chip of claim 2, further comprising:
   an additional interconnect structure that is a same material as the lower interconnect structure, wherein the horizontal plane extends through sidewalls of the additional interconnect structure.

4. The integrated chip of claim 1, wherein the first interconnect structure comprises a liner laterally contacting the dielectric structure.

5. The integrated chip of claim 1, wherein a bottommost surface of the first interconnect structure is between the topmost surface of the lower interconnect structure and the substrate.

6. The integrated chip of claim 1, wherein the lower interconnect structure has a width that is less than approximately 30 nm.

7. The integrated chip of claim 1, wherein the first interconnect structure is a conductive wire and the lower interconnect structure comprises a conductive via.

8. The integrated chip of claim 1, wherein the lower interconnect structure continuously extends between first sidewalls of the dielectric structure and the first interconnect structure continuously extends between second sidewalls of the dielectric structure.

9. An integrated chip, comprising:
   a dielectric structure arranged over an upper surface of a substrate;
   a plurality of first interconnect structures arranged within the dielectric structure and vertically extending from a first horizontal plane to a second horizontal plane between the substrate and the first horizontal plane;
   a second interconnect structure laterally separating a part of a sidewall of a first one of the plurality of first interconnect structures from a sidewall of the dielectric structure facing the part of the sidewall, wherein the plurality of first interconnect structures and the second interconnect structure comprise one or more different conductive materials; and
   wherein the second interconnect structure has a bottom surface that faces the substrate and that is separated from the second horizontal plane by a non-zero distance.

10. The integrated chip of claim 9, wherein the dielectric structure continuously extends between a sidewall of a second one of the plurality of the first interconnect structures and a sidewall of the second interconnect structure.

11. The integrated chip of claim 9, wherein the second interconnect structure comprises a conductive material surrounded by a first liner.

12. The integrated chip of claim 9, wherein the plurality of first interconnect structures comprise:
    an upper first interconnect structure having a first bottommost surface; and
    a lower first interconnect structure having a second bottommost surface vertically between the first bottommost surface and the substrate, wherein the upper first interconnect structure is laterally separated from the lower first interconnect structure.

13. The integrated chip of claim 9, wherein the second interconnect structure has a bottommost surface that is disposed along a horizontal line that is vertically offset from a bottommost surface of a second one of the plurality of first interconnect structures by a second non-zero distance.

14. An integrated chip, comprising:
    an inter-level dielectric (ILD) layer disposed over an upper surface of a substrate;
    a first interconnect structure arranged within the ILD layer;
    a second interconnect structure arranged within the ILD layer and comprising a conductive core and a liner separating the conductive core from the ILD layer, wherein the first interconnect structure and the second interconnect structure comprise one or more different conductive materials;
    an additional interconnect structure that is a same material as the first interconnect structure, wherein the second interconnect structure wraps around a top of the additional interconnect structure; and
    wherein a horizontal plane that is parallel to the upper surface of the substrate extends through sidewalls of the first interconnect structure and the second interconnect structure, and wherein the one or more different conductive materials of the first interconnect structure and the second interconnect structure extend to an uppermost surface of the ILD layer.

15. The integrated chip of claim 14, further comprising:
    a lower ILD layer disposed between the ILD layer and the substrate;
    a first lower interconnect structure arranged within the lower ILD layer; and
    a second lower interconnect structure arranged within the lower ILD layer, wherein the first lower interconnect structure and the second lower interconnect structure comprise the one or more different conductive materials.

16. The integrated chip of claim 14, further comprising:
    an etch stop layer disposed between the ILD layer and the substrate, wherein the ILD layer is disposed directly between a bottommost surface of the second interconnect structure and the etch stop layer along a vertical line that is perpendicular to the upper surface of the substrate.

17. The integrated chip of claim 14, wherein the additional interconnect structure has a top surface contacting a lower surface of the second interconnect structure.

18. The integrated chip of claim 14, wherein the additional interconnect structure has a topmost surface facing away from the substrate and that is between interior sidewalls of the second interconnect structure.

19. The integrated chip of claim 14, wherein the second interconnect structure has a bottommost surface that is vertically separated from the substrate by a different distance than a bottommost surface of the first interconnect structure.

20. The integrated chip of claim 14, wherein the liner covers a bottom surface of the conductive core that faces the substrate.

* * * * *